(12) United States Patent
Naito

(10) Patent No.: US 9,402,327 B2
(45) Date of Patent: Jul. 26, 2016

(54) ELECTRONIC APPARATUS HAVING JACK CONNECTOR

(71) Applicant: CANON KABUSHIKI KAISHA, Tokyo (JP)

(72) Inventor: Dai Naito, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/502,671

(22) Filed: Sep. 30, 2014

(65) Prior Publication Data

US 2015/0098201 A1    Apr. 9, 2015

(30) Foreign Application Priority Data

Oct. 7, 2013  (JP) .................... 2013-210174

(51) Int. Cl.
| | |
|---|---|
| *H05K 7/14* | (2006.01) |
| *H01R 13/56* | (2006.01) |
| *G03B 17/00* | (2006.01) |
| *H01R 4/48* | (2006.01) |
| *H01R 12/72* | (2011.01) |
| *H01R 24/58* | (2011.01) |

(52) U.S. Cl.
CPC ............ *H05K 7/1422* (2013.01); *G03B 17/00* (2013.01); *H01R 13/56* (2013.01); *H01R 4/489* (2013.01); *H01R 12/722* (2013.01); *H01R 24/58* (2013.01)

(58) Field of Classification Search
CPC ............. H05K 7/142; H05K 7/1422; H05K 2201/10189; H05K 2201/2036; H05K 1/0233; H05K 1/18; H05K 2201/1003; H05K 2201/1006; H05K 2201/10515; H05K 2201/10537; H05K 2201/10568; H05K 1/181; H05K 5/0013; H05K 5/0017; H05K 5/061; H05K 1/14; H05K 1/144; H05K 2201/10757; H05K 3/3447; H05K 3/4691; H05K 1/0219; H05K 1/114; H05K 1/141; H05K 1/147; H05K 1/148; H05K 2201/0311; H05K 2201/0314; H05K 2201/049; H05K 2201/09063; H05K 2201/09227; H05K 2201/10409; H05K 2201/10545; H05K 2201/10734; H05K 3/363; H05K 3/368; H05K 3/429; H05K 7/1489; H05K 7/1492; H05K 7/20736; H05K 9/0022; H01R 4/489; G06F 1/1658; G06F 1/1656; G06F 1/1626; G06F 1/1616; G06F 1/1637; G06F 1/1632; G06F 1/1633; G06F 1/1669; G06F 1/1683; G06F 21/31; G06F 3/14; G06F 1/16; G06F 1/1601; G06F 1/1605; G06F 1/1635; G06F 1/187; G06F 2200/1631; G06F 1/1628; G06F 1/1684; G06F 1/182; G06F 1/188; G06F 3/16
USPC ............ 361/679.4, 736, 760, 679.01, 679.02; 312/223.1–223.2
See application file for complete search history.

(56) References Cited

U.S. PATENT DOCUMENTS

2008/0242146 A1* 10/2008 Ishibashi .................. H04R 3/00
439/567

FOREIGN PATENT DOCUMENTS

| JP | 10-289763 A | 10/1998 |
|---|---|---|
| JP | 2003-234547 A | 8/2003 |

*Primary Examiner* — Anthony Haughton
*Assistant Examiner* — Ingrid Wright
(74) *Attorney, Agent, or Firm* — Cowan, Liebowitz & Latman, P.C.

(57) ABSTRACT

An electronic apparatus which is capable of preventing a joint between a jack connector and a connector substrate from being broken due to prying after insertion of a plug without bringing about an increase in the size of the connector substrate. In a cantilever spring portion of a chassis, hooking portions that penetrate holes formed in the connector substrate and hook the connector substrate are provided on both sides in a width direction of the connector substrate which is vertical to a direction in which the plug is inserted. A screw, which fastens the connector substrate to the cantilever spring portion, is disposed in the same line as the plug insertion direction and on an opposite side of a plug insertion opening in the jack connector. When the connector substrate is not bent, a space is formed between the connector substrate and an end of the hooking portion.

9 Claims, 8 Drawing Sheets

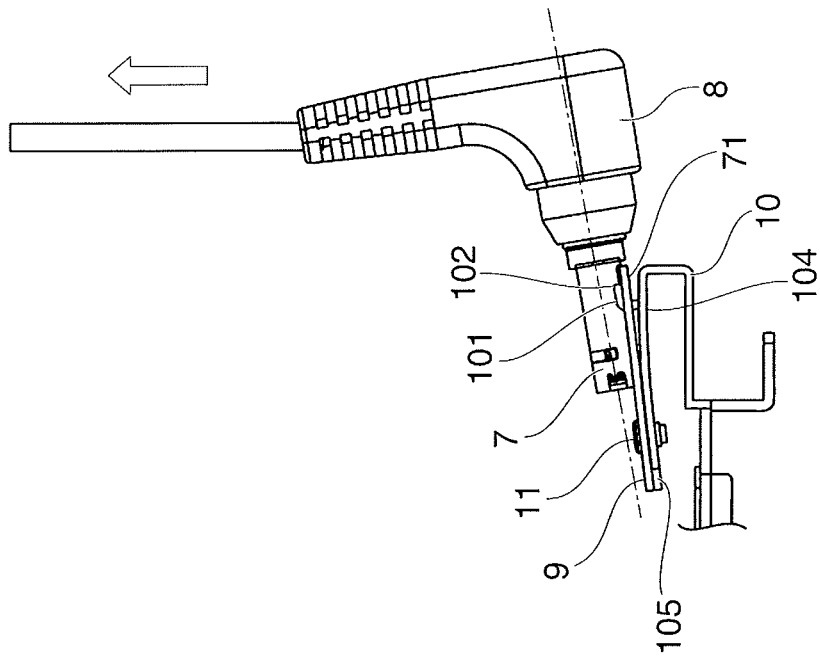
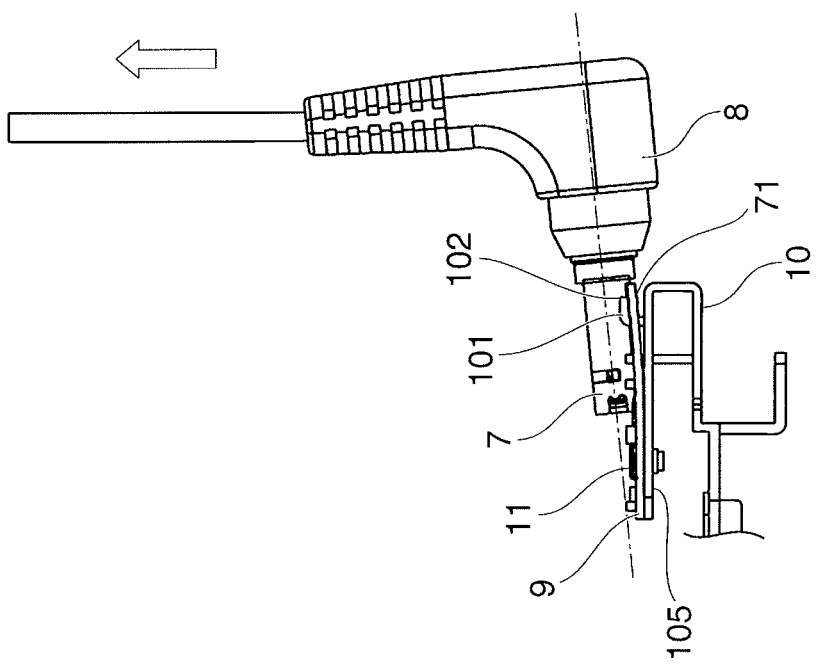

ELECTRONIC APPARATUS HAVING JACK CONNECTOR

BACKGROUND OF THE INVENTION

1. Field of the Invention

The invention relates to an electronic apparatus such as a digital camera or a digital video camera which has a jack connector into and from which a plug is inserted and extracted.

2. Description of the Related Art

There have been known electronic apparatuses such as digital cameras in which a jack connector into and from which a plug is inserted and extracted is mounted on a print substrate, and the printed substrate is disposed such that a plug insertion opening of the jack connector exposes itself from a hole formed in an outer covering member.

Such electronic apparatuses have a problem that a great force is applied to the jack connector by prying after insertion of the plug, resulting in breaking of a solder joint between the jack connector and the print substrate.

Accordingly, there has been proposed a technique that forms slits at both ends of a jack connector mounted portion of a substrate so that the substrate can be bent to prevent breaking of a solder joint between the jack connector and the substrate due to prying described above (see Japanese Laid-Open Patent Publication (Kokai) No. 2003-234547).

There has also been proposed a technique that forms a square U-shaped slit around a jack connector mounted portion of a substrate so as to make a jack connector mounted portion independent, and electrically connects the jack connector mounted portion and a main body of the substrate to each other by a jumper line (see Japanese Laid-Open Patent Publication (Kokai) No. H10-289763).

However, according to the techniques described in Japanese Laid-Open Patent Publication (Kokai) No. 2003-234547 and Japanese Laid-Open Patent Publication (Kokai) No. H10-289763, because a slit is formed around a jack connector mounted portion of a substrate, the area of surface mounting on the substrate decreases, and the substrate increases in size.

SUMMARY OF THE INVENTION

The invention provides an electronic apparatus which is capable of preventing a joint between a jack connector and a connector substrate from being broken due to prying after insertion of a plug without bringing about an increase in the size of the connector substrate.

Accordingly, an aspect of the invention provides an electronic apparatus comprising a jack connector into and from which a plug is inserted and extracted, a connector substrate on which the jack connector is mounted, a chassis configured to be extended in a direction in which the plug is inserted and have a cantilever spring portion, and a fastening member configured to fasten the connector substrate to the cantilever spring portion, wherein in the cantilever spring portion, hooking portions that penetrate holes formed in the connector substrate and hook the connector substrate are provided on both sides in a width direction of the connector substrate which is vertical to the direction in which the plug is inserted, the fastening member is disposed in the same line as the direction in which the plug is inserted and on an opposite side of a plug insertion opening in the jack connector, and when the connector substrate is not bent, a space is formed between the connector substrate and an end of the hooking portion.

According to the invention, the connector substrate on which the jack connector into and from which the plug is inserted and extracted is mounted is fastened to the cantilever spring portion of the chassis by the fastening member. In the cantilever spring portion, the hooking portions which are hooked on the connector substrate are provided on both sides in the width direction of the connector substrate, and when the connector substrate is not bent, the space is formed between the connector substrate and the end of the hooking portion. When a prying force is applied to the jack connector, the connector substrate is bent, causing the space between the connector substrate and the end of the hooking portion to decrease, so that the ends come into contact with the connector substrate. As a result, the prying force applied to the jack connector is received not only by a joint between the jack connector and the connector substrate but also by the end of the hooking portion. This can prevent the joint between the jack connector and the connector substrate from being broken due to prying after insertion of the plug can be prevented without bringing about an increase in the size of the connector substrate.

Further features of the invention will become apparent from the following description of exemplary embodiments (with reference to the attached drawings).

BRIEF DESCRIPTION OF THE DRAWINGS

FIG. 7A is a view which is useful in explaining behaviors when a prying force is applied to a microphone jack connector in a direction toward the front of the camera main body, and FIG. 7B is a view which is useful in explaining behaviors when a prying force is further applied to the microphone jack connector in a direction toward the front of the camera main body.

DESCRIPTION OF THE EMBODIMENTS

The invention will now be described with reference to the drawings showing an embodiment thereof.

Figure 1A:
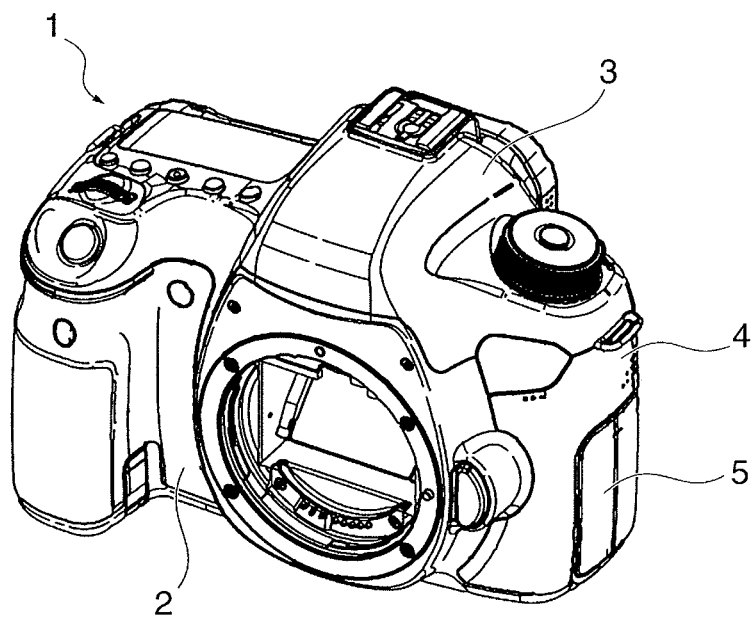
FIG. 1A is a perspective view showing a camera main body of a digital single-lens reflex camera, which is an electronic apparatus according to an embodiment of the invention, as viewed from a front side (subject side)
Figure 1B:
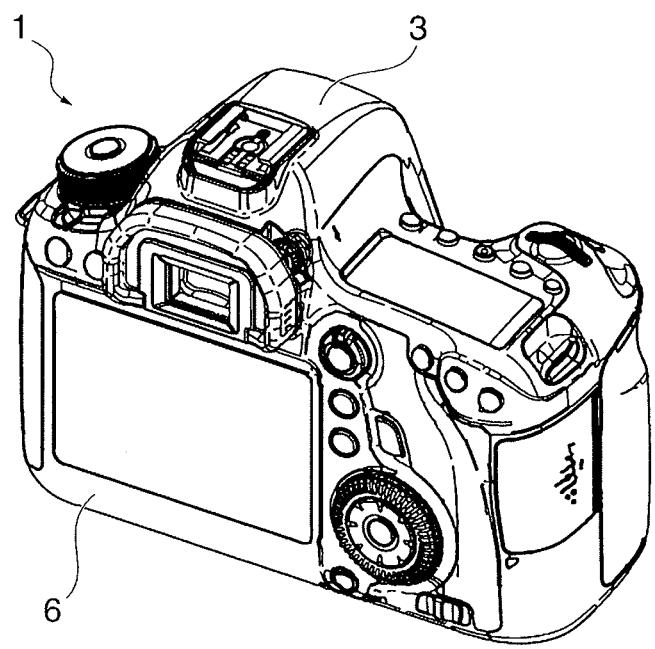
FIG. 1B is a perspective view showing the camera main body in FIG. 1A as viewed from a rear side.

FIG. 1A is a perspective view showing a camera main body 1 of a digital single-lens reflex camera, which is an electronic apparatus according to an embodiment of the invention, as viewed from a front side (subject side), and FIG. 1B is a perspective view showing the camera main body 1 in FIG. 1A as viewed from a rear side.

The digital single-lens reflex camera according to the present embodiment is constructed such that an outer covering of the camera main body 1 is comprised of a front cover 2, an upper cover 3, a side cover 4, a terminal cover 5, and a rear cover 6 as shown in FIGS. 1A and 1B. The terminal cover 5 is made of a material having elasticity such as elastomer.

Figure 2:
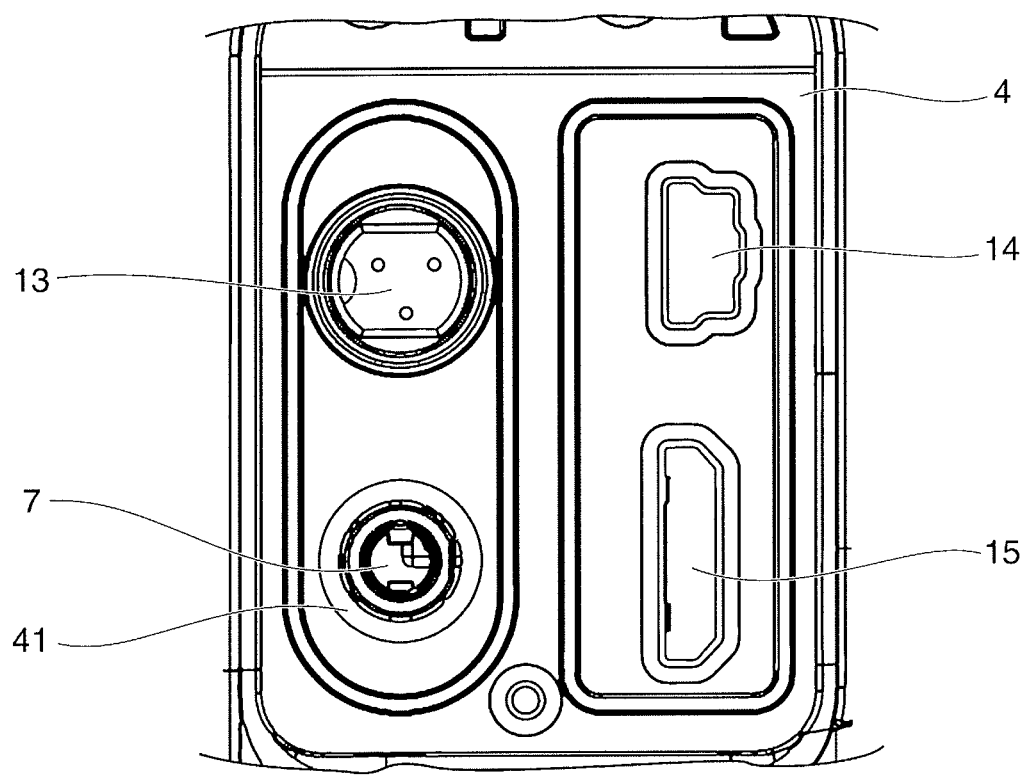
FIG. 2 is a view showing the camera main body in FIG. 1A with its terminal cover opened.

FIG. 2 is a view showing the camera main body 1 in FIG. 1A with the terminal cover 5 thereof opened. It should be noted that in FIG. 2, the terminal cover 5 is omitted for the sake of convenience.

Referring to FIG. 2, at least one opening 41 for placing a terminal is formed in a part of the side cover 4 which is covered with the terminal cover 5. In the present embodiment, four openings 41 in which a microphone jack connector 7, a remote control connector 13, a USB connector 14, and an HDMI (registered trademark) connector 15 are disposed are formed.

A microphone plug 8 (hereafter referred to as the plug 8: see FIG. 6), which is an external accessory, is inserted into and extracted from the microphone jack connector 7 to play a role in adding sound data to moving image data when recording moving image data. A plug of a remote control cable, not shown, is inserted into and extracted from the remote control connector 13 to receive signals such as shutter release operation signals from an external remote control. A plug of a USB cable, not shown, is inserted into and extracted from the USB connector 14, for communication with a personal computer or the like having a USB terminal. A plug of an HDMI (registered trademark) cable, not shown, is inserted into and extracted from the HDMI (registered trademark) connector 15 to connect with a digital television or the like having an HDMI (registered trademark) terminal so that video/sound signals can be transmitted to the digital television.

Figure 3:
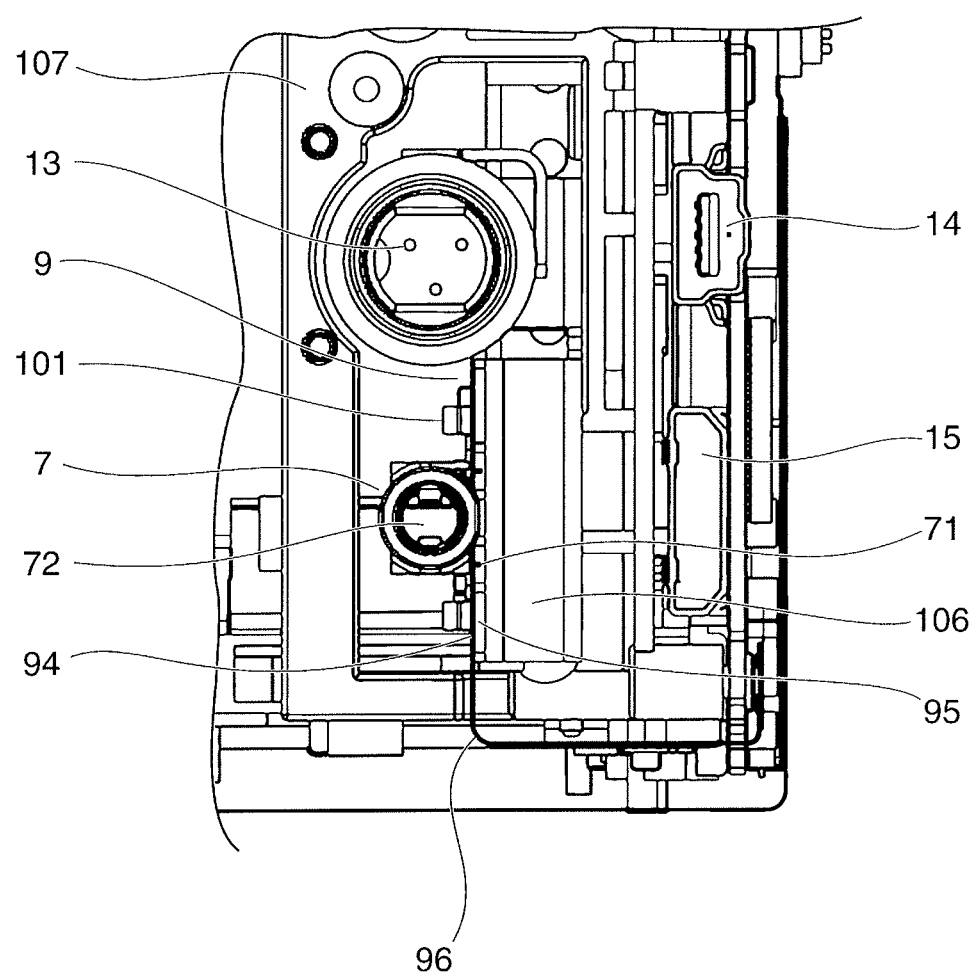
FIG. 3 is a view showing a state where a side cover in FIG. 2 is detached.
Figure 4:
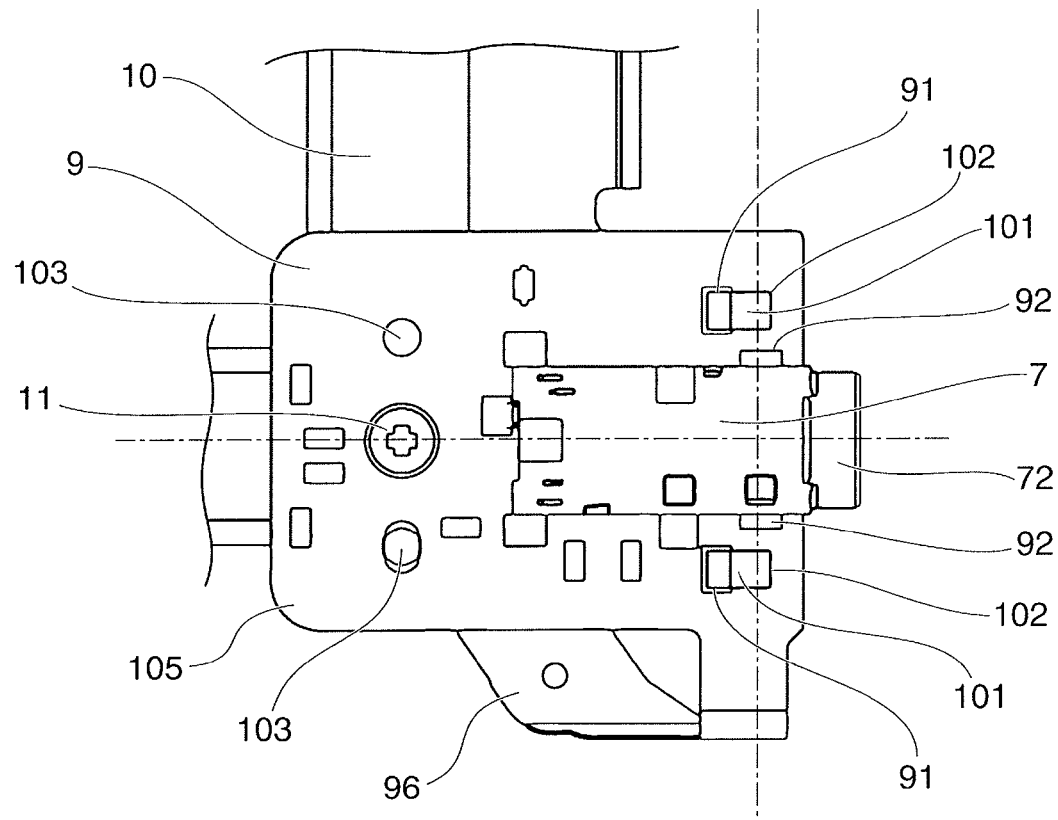
FIG. 4 is a view showing an internal construction of a right-hand portion of the camera main body when the camera main body is viewed from the front side.
Figure 5:
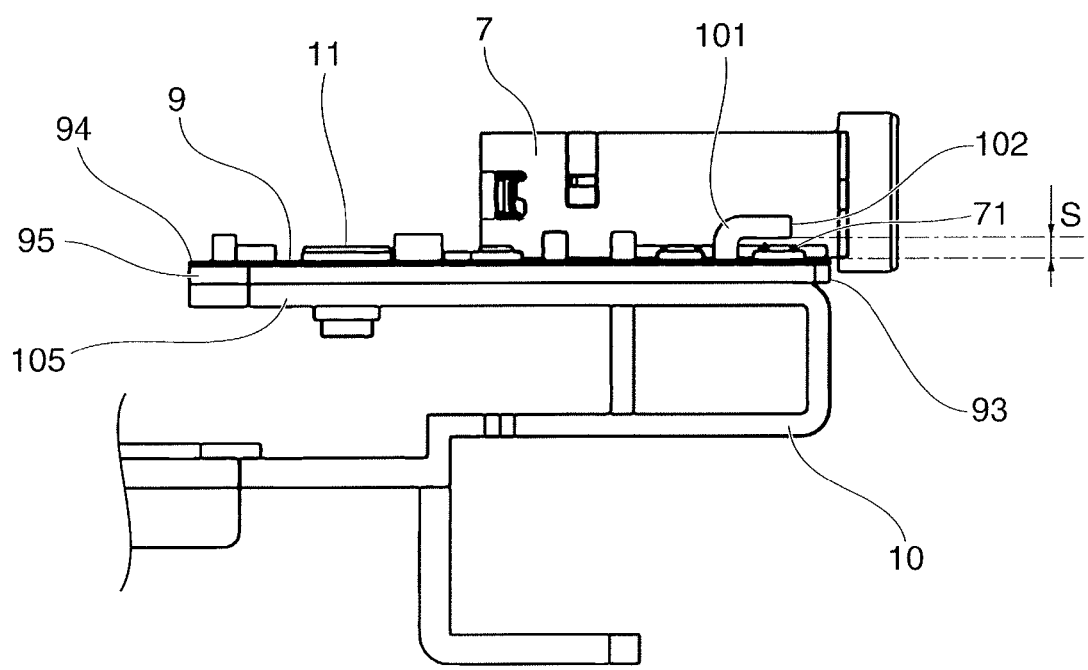
FIG. 5 is a view showing the internal construction in FIG. 4 as viewed from below.
Figure 6:
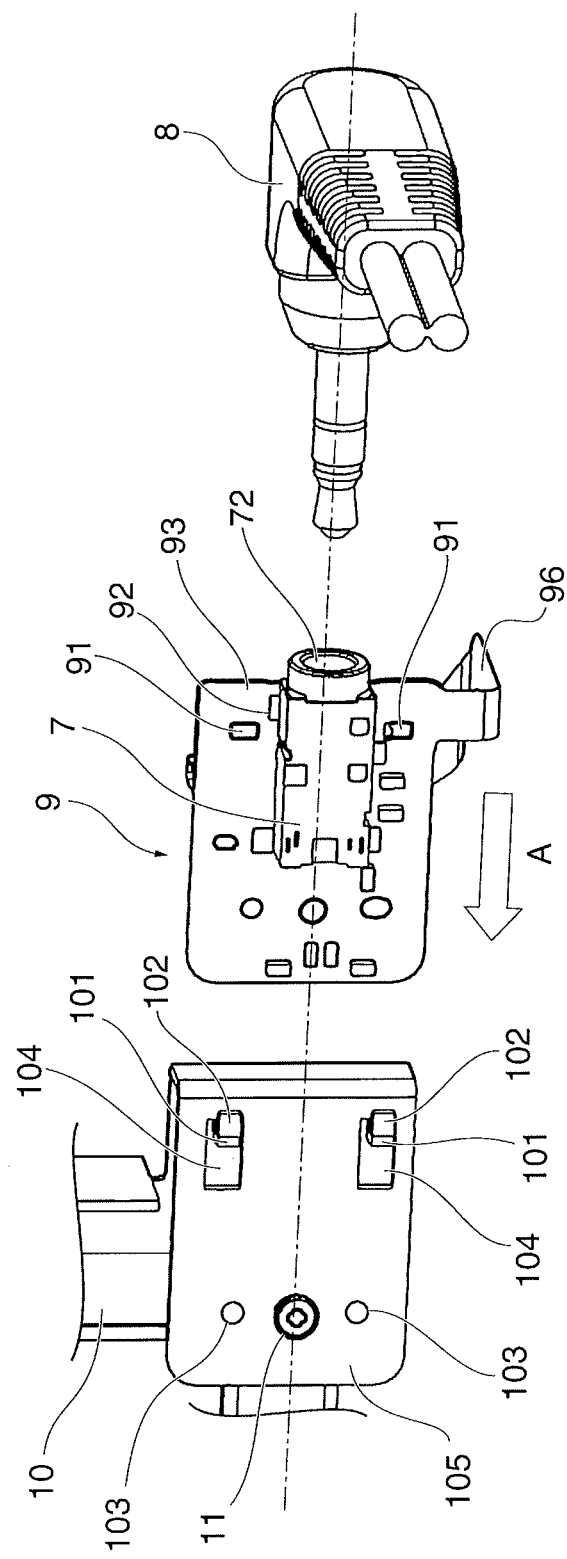
FIG. 6 is a perspective view showing a state before a connector substrate is mounted on a chassis.

FIG. 3 is a view showing a state where the side cover 4 in FIG. 2 is removed. FIG. 4 is a view showing an internal construction of a right-hand portion of the camera main body 1 as viewed from the front side. FIG. 5 is a view showing the internal construction in FIG. 4 as viewed from below. FIG. 6 is a perspective view showing a state before a connector substrate 9 is mounted on a chassis 10.

As shown in FIGS. 3 to 6, the connector substrate 9 (hereafter referred to as the substrate 9) is constructed by attaching a reinforcing plate 95 made of glass epoxy resin or the like to a flexible substrate 94. On the substrate 9, a pattern constituting a circuit for controlling sound signals input from a microphone is formed, and various electric elements are mounted. The microphone jack connector 7 is surface-mounted on the substrate 9. The flexible substrate 94 is provided with a lead portion 96 for use in connection with other substrates. The microphone jack connector 7 is provided with a reinforcing terminal 71, and by joining the reinforcing terminal 71 to a reinforcing land 92 of the substrate 9 with solder, the strength with which the microphone jack connector 7 is surface-mounted on the substrate 9 is enhanced.

The chassis 10, which has a metallic portion 106 and a resin portion 107, is formed by stamping the metallic portion 106 and then insert-molding the resin portion 107. The metallic portion 106 of the chassis 10 is electrically connected to a ground of a battery, not shown. The substrate 9 is mounted on the chassis 10 in a direction indicated by an arrow A in FIG. 6.

Referring to FIG. 5, a part of the metallic portion 106 of the chassis 10 on which the substrate 9 is mounted is a one-side abutting spring portion 105 extended in a direction in which the plug 8 is inserted from an end portion 93 of the substrate 9 on the plug 8 insertion side and has elasticity. The one-side abutting spring portion 105 has the same thickness as that of the substrate 9.

A screw 11 fastens the substrate 9, on which the microphone jack connector 7 is mounted, to the one-side abutting spring portion 105 of the chassis 10. At the time of fastening, the substrate 9 is positioned with respect to the chassis 10 by positioning pins 103 provided in the one-side abutting spring portion 105. A ground signal on the substrate 9 is electrically connected to the chassis 10 by the screw 11, and the chassis 10 is electrically connected to a ground of a battery, not shown. Here, the screw 11 corresponds to an exemplary fastening member according to the invention.

The one-side abutting spring portion 105 is provided with hooking claws 101 on both sides in a width direction of the substrate 9, which is vertical to the direction in which the plug 8 is inserted, and the hooking claws 101 penetrate holes 91 formed in the substrate 9 with spaces left therebetween and hook the substrate 9. As shown in FIG. 6, holes 104 for press-molding the hooking claws 101 are formed in the one-side abutting spring portion 105.

Further, as shown in FIG. 4, ends 102 of the hooking claws 101, the reinforcing land 92 of the substrate 9, and the reinforcing terminal 71 of the microphone jack connector 7, which is joined to the reinforcing land 92 by soldering, are disposed in a line that extends in the width direction of the substrate 9 which is vertical to the direction in which the plug 8 is inserted. The screw 11 is disposed in substantially the same line as the direction in which the plug 8 is inserted into the microphone jack connector 7 and on the opposite side of a plug insertion opening 72 of the microphone jack connector 7. It should be noted that as shown in FIG. 5, when the substrate 9 is not bent, a space S is formed between the substrate 9 and the ends 102 of the hooking claws 101. Namely, the ends 102 of the hooking claws 101 are not in contact with the substrate 9.

FIG. 7A is a view which is useful in explaining behaviors when a prying force is applied to the microphone jack connector 7 in a direction toward the front of the camera main body 1.

As shown in FIG. 7A, when a prying force is applied to the microphone jack connector 7 in a direction toward the front of the camera main body 1, the substrate 9 on which the microphone jack connector 7 is mounted is bent in the prying direction and abuts against the ends 102 of the hooking claws 101. Namely, as the substrate 9 is bent in the prying direction, the space S formed between the ends 102 of the hooking claws 101 and the substrate 9 gradually becomes smaller, causing the ends 102 of the hooking claws 101 to come into contact with the substrate 9. Until the ends 102 of the hooking claws 101 come into contact with the substrate 9, the substrate 9 lifts off the one-side abutting spring portion 105 as the substrate 9 is bent in the prying direction. Namely, even when a prying force is applied to the microphone jack connector 7 in a direction toward the front of the camera main body 1, the amount by which the substrate 9 is deformed in the bending direction is smaller than the amount by which the one-side abutting spring portion 105 is deformed in the bending direction.

Here, as described earlier, the ends 102 of the hooking claws 101, the reinforcing terminal 71 of the microphone jack connector 7, and the reinforcing land 92 are disposed in the line that extends in the width direction of the substrate 9. For this reason, bending of the substrate 9 causes the ends 102 of the hooking claws 101 to receive the prying force applied to the reinforcing terminal 71 and the reinforcing land 92.

After the substrate 9 is bent to abut against the ends 102 of the hooking claws 101, the prying force is received not only by force of solder joining of the microphone jack connector 7 and the substrate 9 but also by the ends 102 of the hooking claws 101, and hence resistance to prying force increases.

FIG. 7B is a view which is useful in explaining behaviors when prying force is further applied to the microphone jack connector 7 in a direction toward the front of the camera main body 1.

As shown in FIG. 7B, when a prying force is further applied to the substrate 9 abutting against the ends 102 of the hooking claws 101 and to the microphone jack connector 7 in the state shown in FIG. 7A, a force acts on the screw 11 of the substrate 9 with the ends 102 of the hooking claws 101 as fulcrums. Because the substrate 9 and the one-side abutting spring portion 105 are fastened to each other by the screw 11, the force applied to the screw 11 is transmitted to the one-side abutting spring portion 105.

Here, as described earlier, the holes 104 for molding the hooking claws 101 are formed in the one-side abutting spring portion 105. Thus, when the force applied to the screw 11 is transmitted to the one-side abutting spring portion 105, the one-side abutting spring portion 105 starts bending from the holes 104 at which bending strength is low. For this reason, the prying force is received not only by force of solder joining of the microphone jack connector 7 and the substrate 9 but also by the ends 102 of the hooking claws 101 against which the substrate 9 abuts, and further, spring force of the one-side abutting spring portion 105 having elasticity. As a result, the load placed on a solder joint between the microphone jack connector 7 and the substrate 9 decreases, and resistance to prying force increases.

Figure 8:
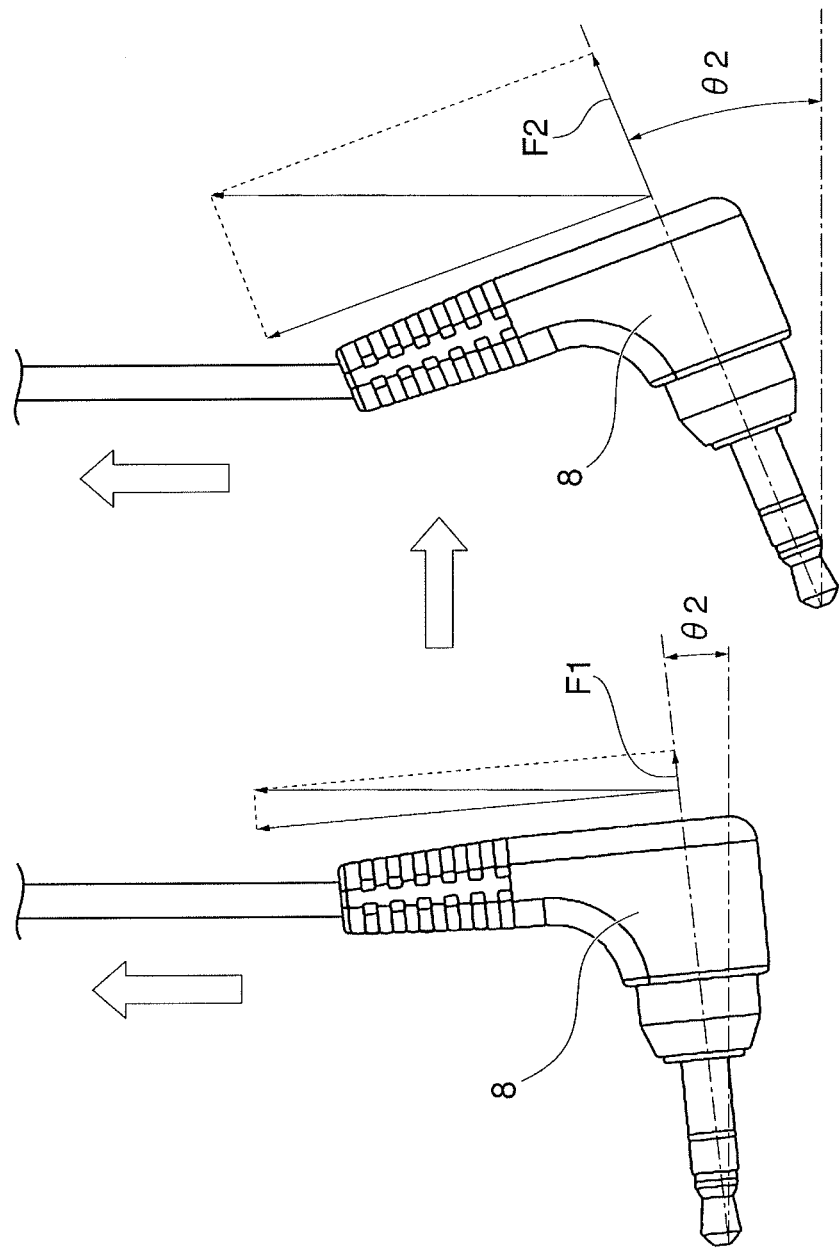
FIG. 8 is a view showing the relationship between the angle of tilt from an initial state of the connector substrate and the microphone jack connector and the force vector in a direction in which a plug is extracted.

FIG. 8 is a view showing the relationship between the angle of tilt θ from an initial state of the substrate 9 and the microphone jack connector 7 and force vector F in the direction in which the plug 8 is extracted. In FIG. 8, (a) corresponds to the state in FIG. 7A, and (b) corresponds to the state in FIG. 7B. As shown in (b) in FIG. 8, the angle of tilt θ2 from the initial state of the substrate 9 and the microphone jack connector 7 in the state in FIG. 7B is greater than the angle of tilt θ1 from the initial state of the substrate 9 and the microphone jack connector 7 in the state in FIG. 7A shown in (a) in FIG. 8. A force vector F2 shown in (b) in FIG. 8 in the direction in which the plug 8 is extracted is greater than force vector F1 shown in (a) in FIG. 8 in the direction in which the plug 8 is extracted. Namely, as the angle of tilt θ from the initial state of the substrate 9 and the microphone jack connector 7 increases, the force vector F in the direction in which the plug 8 is extracted increases. For this reason, as the prying force applied to the microphone jack connector 7 increases, the plug 8 is more easily extracted from the microphone jack connector 7, and the load placed on the microphone jack connector 7 and the substrate 9 decreases.

Figure 9:
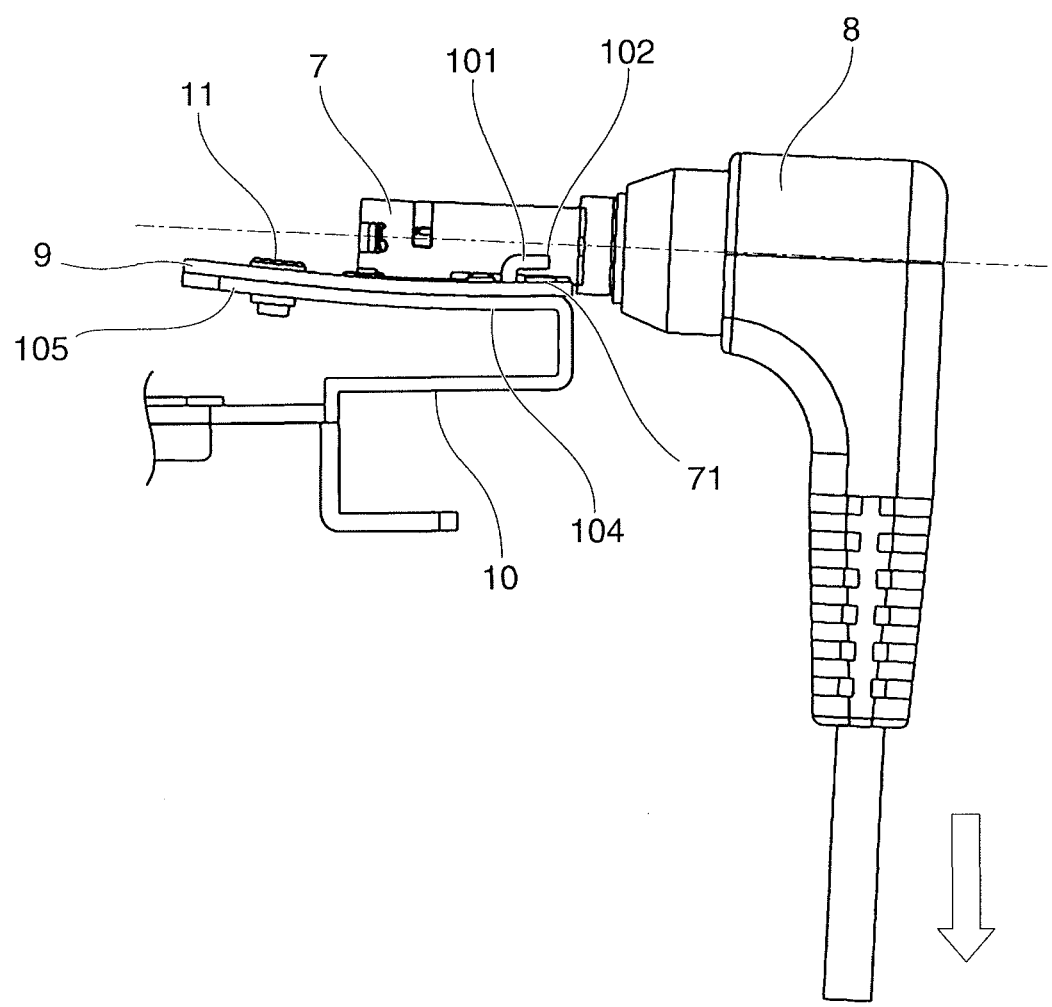
FIG. 9 is a view which is useful in explaining behaviors when a prying force is applied to the microphone jack connector in a direction toward the rear of the camera main body.

Referring now to FIG. 9, a description will be given of behaviors when a prying force is applied to the microphone jack connector 7 in a direction toward the rear of the camera main body 1.

As shown in FIG. 9, when a prying force is applied to the microphone jack connector 7 in the direction toward the rear of the camera main body 1, the microphone jack connector 7 and the substrate 9 are bent in the prying direction. Because the substrate 9 is fastened to the one-side abutting spring portion 105 of the chassis 10 by the screw 11, the one-side abutting spring portion 105 starts bending from the holes 104 at which bending strength is low.

Referring to FIG. 9, because not only the substrate 9 but also the one-side abutting spring portion 105 of the chassis 10 receive the prying force at the same time, the amount by which the substrate 9 is deformed is smaller as compared to the case where the prying force is received only by the substrate 9. As a result, the load placed on a solder joint between the microphone jack connector 7 and the substrate 9 decreases, and resistance to prying force increases.

On the other hand, when the camera main body 1 is equipped with high-speed communication terminals such as the USB connector 14 and the HDMI (registered trademark) connector 15, degradation in radiation noise performance may be a problem. In the present embodiment, even a substrate on which the USB connector 14 and the HDMI (registered trademark) connector 15 are mounted can be fastened to the one-side abutting spring portion 105 of the chassis 10 in the same manner as described above. As described earlier, a ground signal on a substrate is connected to the chassis 10 by a screw and electrically connected to a ground of a battery, not shown, and therefore, even when the camera main body 1 is equipped with high-speed communication terminals such as the USB connector 14 and the HDMI (registered trademark) connector 15, radiation noise performance can be improved.

As described above, according to the present embodiment, even if no slit is formed around the area where the microphone jack connector 7 is mounted on the substrate 9, breaking of a solder joint between the microphone jack connector 7 and the substrate 9 due to prying force described above can be prevented by bending the substrate 9. For this reason, an increase in the size of the substrate 9 caused by formation of a slit can be avoided. Moreover, even when the camera main body 1 is equipped with high-speed communication terminals such as the USB connector 14 and the HDMI (registered trademark) connector 15, radiation noise performance can be improved, and hence satisfactory communication characteristics can be ensured.

OTHER EMBODIMENTS

Embodiments of the invention can also be realized by a computer of a system or apparatus that reads out and executes computer executable instructions recorded on a storage medium (e.g., non-transitory computer-readable storage medium) to perform the functions of one or more of the above-described embodiment(s) of the invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-210174 filed Oct. 7, 2013, which is hereby incorporated by reference herein in its entirety.

What is claimed is:

1. An electronic apparatus comprising:
   a jack connector which has a plug insertion opening;
   a connector substrate on which the jack connector is mounted; and
   a chassis on which the connector substrate is fixed,
   wherein the chassis has a cantilever portion extended in an inserted direction in which a plug is inserted from the plug in opening,
   wherein the cantilever portion has a hooking portion and a fixed portion on which the connector substrate is fixed,
   wherein the hooking portion and the fixed portion are arranged so that the fixed portion is arranged far from an arranged portion of the hooking portion in the inserted direction,
   wherein in a case where the connector substrate is not bent, a space is formed between the connector substrate and an end of the hooking portion, and
   wherein in a case where the connector substrate is bent so as to alienate the connector substrate from the cantilever portion, the space gradually becomes smaller and after that the end of the hooking portion comes into contact with the connector substrate.

2. The electronic apparatus according to claim 1, wherein the jack connector is provided with a reinforcing terminal which is joined to a reinforcing land provided in the connector substrate.

3. The electronic apparatus according to claim 2, wherein the reinforcing terminal and the reinforcing land are disposed in a line that extends in the width direction of the connector substrate which is vertical to the direction in which the plug is inserted.

4. The electronic apparatus according to claim 1, wherein the cantilever portion and the connector substrate have the same thickness.

5. The electronic apparatus according to claim 1, wherein the chassis is electrically connected to a ground, and
   wherein a ground signal on the connector substrate is electrically connected to the chassis.

6. The electronic apparatus according to claim 1, wherein the jack connector is a microphone jack connector, a USB connector, or an HDMI connector.

7. The electronic apparatus according to claim 1, wherein the hooking portion includes a plurality of hooking claws, and
   wherein in a case where the connector substrate is fixed on the cantilever portion, the plurality of hooking claws is aligned in a direction across the inserted direction.

8. The electronic apparatus according to claim 1, wherein the jack connector is sandwiched between the plurality of hooking claws in the direction across the inserted direction.

9. The electronic apparatus according to claim 1, wherein the fixed portion is disposed in the same line as the inserted direction.

* * * * *